United States Patent
Ostholt et al.

(10) Patent No.: US 11,072,041 B2
(45) Date of Patent: Jul. 27, 2021

(54) METHOD FOR PRODUCING A TECHNICAL MASK

(71) Applicant: LPKF Laser & Electronics AG, Garbsen (DE)

(72) Inventors: Roman Ostholt, Langenhagen (DE); Norbert Ambrosius, Garbsen (DE); Arne Schnoor, Hannover (DE); Daniel Dunker, Hannover (DE); Kevin Hale, Garbsen (DE); Moritz Doerge, Suthfeld (DE); Stephan Wenke, Neustadt am Ruebenberge (DE)

(73) Assignee: LPKF LASER & ELECTRONICS AG, Garbsen (DE)

( * ) Notice: Subject to any disclaimer, the term of this patent is extended or adjusted under 35 U.S.C. 154(b) by 0 days.

(21) Appl. No.: 16/490,901

(22) PCT Filed: Mar. 5, 2018

(86) PCT No.: PCT/EP2018/055301
§ 371 (c)(1),
(2) Date: Sep. 4, 2019

(87) PCT Pub. No.: WO2018/162386
PCT Pub. Date: Sep. 13, 2018

(65) Prior Publication Data
US 2020/0016696 A1 Jan. 16, 2020

(30) Foreign Application Priority Data

Mar. 6, 2017 (DE) .................. 10 2017 104 656.9
Mar. 6, 2017 (DE) .................. 10 2017 104 657.7

(51) Int. Cl.
*B23K 26/53* (2014.01)
*C23C 14/04* (2006.01)
*B23K 103/00* (2006.01)

(52) U.S. Cl.
CPC ............ *B23K 26/53* (2015.10); *C23C 14/042* (2013.01); *B23K 2103/54* (2018.08)

(58) Field of Classification Search
None
See application file for complete search history.

(56) References Cited

U.S. PATENT DOCUMENTS

| | | |
|---|---|---|
| 2003/0101932 A1 | 6/2003 | Kang et al. |
| 2005/0019674 A1* | 1/2005 | Okubo ...................... G03F 1/80 430/5 |
| 2012/0129359 A1 | 5/2012 | Keisuke et al. |

(Continued)

FOREIGN PATENT DOCUMENTS

| | | |
|---|---|---|
| JP | 2002103838 A | 4/2002 |
| JP | 2005190857 A | 7/2005 |

(Continued)

*Primary Examiner* — Roberts P Culbert
(74) *Attorney, Agent, or Firm* — Leydig, Voit & Mayer Ltd.

(57) ABSTRACT

A method for producing a technical mask includes: providing a technical mask including at least one plate-shaped substrate, the plate-shaped substrate being transparent to at least one laser wavelength; and producing at least one opening in the mask by laser-induced deep etching. In an embodiment, an etching attack takes place at least temporarily on one side during laser-induced deep etching.

21 Claims, 3 Drawing Sheets

(56) References Cited

U.S. PATENT DOCUMENTS

| | | |
|---|---|---|
| 2014/0147623 A1 | 5/2014 | Domey et al. |
| 2015/0147838 A1 | 5/2015 | Ookawara |
| 2015/0210074 A1 | 7/2015 | Chen et al. |
| 2016/0059359 A1 | 3/2016 | Krueger et al. |
| 2017/0256422 A1 | 9/2017 | Ambrosius et al. |

FOREIGN PATENT DOCUMENTS

| | | |
|---|---|---|
| JP | 2007069216 A | 3/2007 |
| JP | 2011037707 A | 2/2011 |
| JP | 2012024823 A | 2/2012 |
| JP | 2015103427 A | 6/2015 |
| JP | 2016508069 A | 3/2016 |
| KR | 1020030046090 A | 6/2003 |
| WO | WO 2014161534 A2 | 10/2014 |
| WO | WO 2016041544 A1 | 3/2016 |

\* cited by examiner

METHOD FOR PRODUCING A TECHNICAL MASK

CROSS-REFERENCE TO PRIOR APPLICATIONS

This application is a U.S. National Phase application under 35 U.S.C. § 371 of International Application No. PCT/EP2018/055301, filed on Mar. 5, 2018, and claims benefit to German Patent Application No. DE 10 2017 104 656.9, filed on Mar. 6, 2017, and to German Patent Application No. DE 10 2017 104 657.7, filed on Mar. 6, 2017. The International Application was published in German on Sep. 13, 2018 as WO 2018/162386 under PCT Article 21(2).

FIELD

The invention relates to a method for producing a technical mask from a plate-shaped substrate.

BACKGROUND

Reusable devices for structured material application or material removal are generally referred to as technical masks with open apertures. These include, inter alia, stencils for stencil printing or shadow masks for deposition methods and removal methods. Printing stencils are used for stencil and screen printing. In these processes, laser-cut steel foils are clamped on frames, for example. For printing, a printing substance is pressed with a doctor blade through the openings in the stencil.

Shadow masks are used as masking for coating processes, for example for sputter or gas phase coating. Shadow masks are frequently used for the production of displays (for example OLED displays). In this case, the mask has, for example, 50 μm large, rectangular openings for each pixel.

For laser-induced deep etching (for example WO 2014/161534 A2 and WO 2016/041544 A1), a transparent material is modified by means of a laser pulse or a pulse sequence over an elongated region along the beam axis, frequently over the entire thickness of the transparent material, e.g. in the case of glass plates, so that the modification is anisotropically etched in a subsequent wet chemical etching bath.

Technical masks are generally produced industrially from very thin stainless steel or other metal sheets. The mask openings (apertures) necessary for the structured material application or removal are introduced by means of laser cutting or photolithographic etching methods. Another way known in the prior art for the production of technical masks is electroforming. A technical mask is usually provided with a very high number of apertures, which in turn under certain circumstances are not subject to any regularities in terms of shape, position and number. The apertures are to frequently have aspect ratios (ratio of material thickness to structural size) of >1:1, as a result of which all isotropic etching methods are ruled out. During the actual material application or removal, the very thin masks must be positioned very flat over or on the material to be processed. For this purpose, the thin metal substrates used in the prior art are subjected to tensile stress in order to avoid deformations and sagging.

As a material for technical masks with open apertures, glass has some fundamental advantages compared to metal. For example, glass has an increased scratch resistance, a high modulus of elasticity and a lower thermal expansion; it does not stretch plastically under load and is significantly more chemically resistant. The transparency of the glass can be utilized for optical methods, for example for aligning.

Despite the cited advantages, glass is not used as a material for technical masks for structured material application or removal. This is primarily due to the preconception that glass is too susceptible to breakage to be used as a material for masks with open apertures. In particular, the application of a tensile stress, as is customary in the prior art for metal masks, is considered to be very critical for the reliability of a technical mask made of glass.

A method in which structures in glass are produced by etching and the breaking strength is therefore sufficiently high is lithography. In this case, a coating is illuminated and is then opened locally. The substrate is subsequently etched to produce the desired structures. In this context, the coating serves as an etching resist. Since the etching attack takes place isotropically at the points at which the etching resist was opened, no structures with a large aspect ratio can be produced therewith, however. In order to be able to produce high-resolution structures in technical masks, chromium nickel foils are structured lithographically. For this purpose, partial regions are masked, and the non-masked regions are etched. The etching process is isotropic, and therefore undercutting of the mask occurs, as a result of which the diameter of the structures produced increases in an uncontrolled manner. These structures are called etching lips.

SUMMARY

In an embodiment, the present invention provides a method for producing a technical mask, comprising: providing a technical mask comprising at least one plate-shaped substrate, the plate-shaped substrate being transparent to at least one laser wavelength; and producing at least one opening in the mask by laser-induced deep etching.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
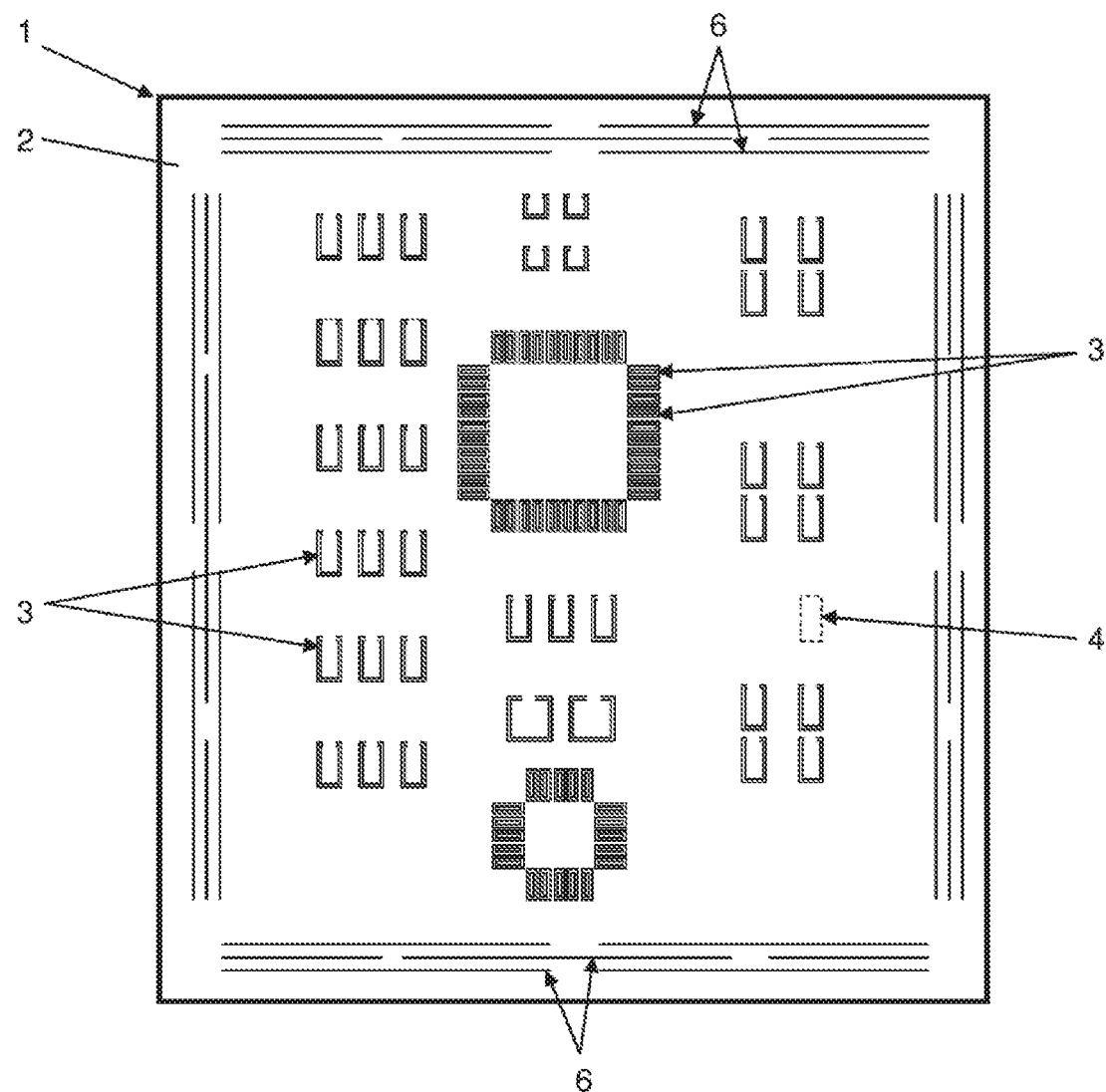
FIG. 1 shows a plan view of a technical mask produced by the method according to the invention.

In an embodiment, the present invention provides a possibility for producing a substantially improved production method for technical masks made of glass.

According to the invention, a technical mask is produced by laser-induced deep etching. For this purpose, a plate-shaped substrate which is transparent for at least the laser wavelength used in laser-induced deep etching is provided with at least one opening. The at least one opening is produced by laser-induced deep etching such that the substrate is first modified with a laser beam along the contour of the opening and is subsequently anisotropically etched in an etching bath at the modified locations.

According to the invention, technical masks are understood to mean, for example, reusable devices for structured material application or material removal.

According to the invention, due to the anisotropic etching attack, a desired edge angle can be achieved, in particular with a predetermined opening angle, which proves to be particularly advantageous particularly when using the glass stencil as shadow masks, for example for sputtering processes.

The invention is based on the surprising finding that glass substrates into which apertures have been introduced by means of laser-induced deep etching can be readily used as a material for structured material application or removal. In this respect, particularly surprising is the finding that a glass substrate produced in this way even withstands the application of tensile stress customary in the prior art.

In the method according to the invention, the shape of the anisotropically etched separating surfaces or recesses can be controlled very precisely by the laser irradiation, and the formation of etching lips can be avoided.

In a second process step, at least one etching step is carried out, wherein the progress, in particular the speed of the etching attack, for example by hydrofluoric acid, depends on the specific properties of the modification. The etching attack can also first be limited to one side, for example by coating the substrate on one side with an etching resist.

Radii can be generated at the cut edges in a further etching step, for example.

The following wet chemical solutions can be realized as etching media, for example:

Hydrofluoric acid:
Concentration: 1-20%
Temperature: 5-40° C.
Second acid: H2SO4, HCL, H3PO4
Potassium hydroxide solution:
Concentration: 10-60%
Temperature: 85-160° C.

In contrast to the methods according to the prior art with which a technical mask of glass with a sufficient breaking strength could not be realized so far because machining always leads to unavoidable microcracks, thus precluding use as a stencil which is clamped in a frame for use and is exposed to high mechanical loads during coating with a doctor blade, such microcracks are avoided according to the invention.

By using glass as the material for technical masks, processes for material application or removal can be carried out more reliably. The following further advantages according to the invention can thus be achieved:

Higher accuracy (no plastic deformation)
Greater hardness, i.e. more abrasion-resistant
Thermal expansion like silicon, ceramic
Greater chemical and mechanical resistance
Simplified alignment by optical methods due to transparent properties The method according to the invention for producing a technical mask 1 from a plate-shaped substrate 2 is explained in more detail below with reference to FIGS. 1 and 2. The plate-shaped substrate 2 is transparent at least for the laser wavelength used for laser-induced deep etching. It can consist, for example, of glass, sapphire or silicon.

The plate-shaped substrate 2 with a thickness s of a few hundred micrometers is modified by the pulses of the laser along predefined machining lines 4 in order to separate, in particular, closed contours 3 by means of laser radiation. In order to cut the contours 3, care is taken that the pulses of the laser are set along the predefined machining lines 4, and the distance between the resulting modification centers is only a few micrometers. Local interruptions of the machining lines in the form of connecting webs, so-called breakout tabs, ensure that the contours 3 to be separated are initially still connected to the plate-shaped substrate 2 even after the treatment with the etching solution.

The plate-shaped substrate 2 pretreated in this way is treated in the following step with an etching solution, such as hydrofluoric acid (HF) or potassium hydroxide (KOH), as a result of which the unmodified regions of the glass substrate 2 are etched homogeneously and isotropically. The modified regions react anisotropically in relation to untreated regions of the substrate 2 so that directed depressions initially form at the treated sites until the material of the substrate 2 has finally completely dissolved at this site. The etching step usually takes a few minutes to a few hours, depending on the substrate 2 used, the thickness s thereof and the concentration of the etching solution.

At this time, the contoured layout separated by recesses 8 is held exclusively by the breakout tabs in the remaining plate-shaped substrate 2 so that, after immersion into a diluting or neutralizing solution and subsequent drying, the desired layouts can be separated from the remaining substrate 2, and the finished technical mask 1 is produced as a result.

The openings may have, in a cross-section, an opening angle to one of the surfaces of >5° to >35°. This can simplify the coating with printing substance, the detachment of the surfaces to be printed or the coating process, or improve the resolution in the application or removal of material.

Figure 2:
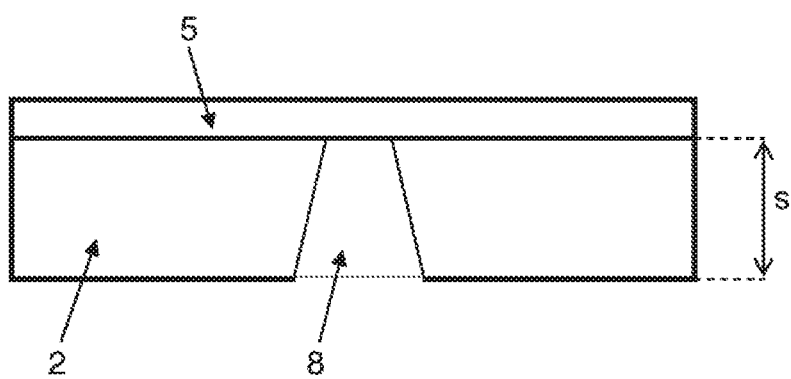
FIG. 2 shows a cross-section through an opening produced according to the invention after the etching treatment.

Moreover, according to the invention, the one-sided etching of the plate-shaped substrate 2 is also possible if one side of the substrate 2 is protected with an etching resist 5, as shown in FIG. 2. For example, chromium layers or adhesive films are used. The one-sided etching makes it possible to produce openings with different height profiles in cross-section.

Adhesive films can additionally be clamped in frames, which in particular simplifies the handling of thin glass with a thickness s of less than 100 μm. With a thickness s of the plate-shaped substrate 2 of less than 100 μm, the substrate 2 behaves similarly to a plastic film and therefore cannot be fixed in a conventional holder in the etching basin.

If a chromium layer is used as an etching resist 5, the contours 3 can also be completely cut out. They then remain adhered to the chromium layer and do not fall into the etching basin. When the chromium layer is removed, in particular in a second etching bath, the cutouts are likewise removed and do not have to be broken out.

When using the technical mask 1, it is preferably clamped into a frame. The frame is preferably provided with a device for clamping the mask. During clamping, the technical mask 1 is exposed to large mechanical stresses. These can be compensated for by relief structures 6 which are suitable for reducing occurring tensile stresses by deformation. The overall deformation achievable by means of these structures is significantly greater than the elongation at break of the material, without the elongation at break being exceeded even just locally. Such relief structures 6 can, for example, be produced in the shape of slits in the edge region of the substrate 2.

The technical mask can be provided at least locally with a metal layer. For example, the metal layer may be used to magnetically attach the mask. The metal layer also enables use as an optical mask.

Figure 3:
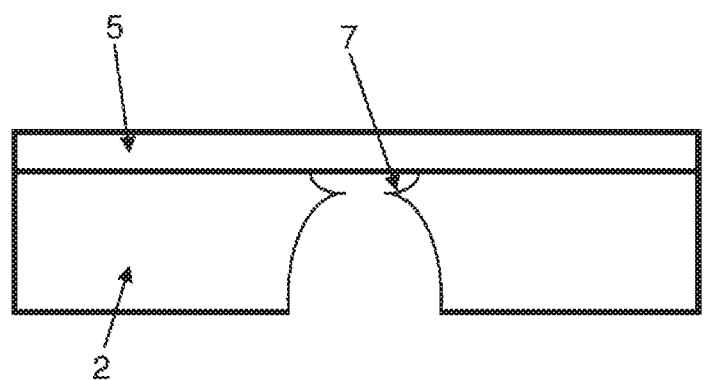
FIG. 3 shows a cross-section through an opening produced by a method according to the prior art after the etching treatment.

For a better understanding, FIG. 3 illustrates an etching treatment with a method according to the prior art using a cross-section through a substrate 2 produced in this way. As can be seen, a so-called etching lip 7 with an undefined opening width is produced as a result of point modifications with uniform propagation and subsequent isotropic etching removal. Since the etching process proceeds isotropically, i.e. the etching rate is the same in all directions, undercutting of the etching resist 5 occurs, as a result of which the diameter of the structures produced increases in an uncontrolled manner. This can be prevented according to the invention by anisotropic etching removal.

Accurate positioning is necessary to use the technical mask for material application or material removal processes. When using transparent materials as a plate-shaped substrate, optical positioning is possible, which can take place, for example, using surface structures, recesses or local coatings.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SYMBOLS

1 Mask
2 Substrate
3 Contour
4 Machining line
5 Etching resist
6 Relief opening
7 Etching lip
8 Recess
s Thickness

The invention claimed is:

1. A method for producing a technical mask, comprising:
   providing a technical mask comprising at least one plate-shaped substrate, the plate-shaped substrate being transparent to at least one laser wavelength; and
   producing at least one opening in the mask by laser-induced deep etching,
   wherein the mask is provided with a frame having a clamp which clamps the mask, and
   wherein the at least one plate-shaped structure includes relief structures which reduce mechanical stresses occurring while the mask is being clamped in the frame.

2. The method according to claim 1, wherein an etching attack takes place at least temporarily on one side during laser-induced deep etching.

3. The method according to claim 1, wherein a material of the at least one plate-shaped substrate comprises glass, silicon, or sapphire.

4. The method according to claim 2, wherein parameters during the laser modification or during the etching attack are selected such that openings in the mask have an opening angle of >5°.

5. The method according to claim 4, wherein the openings in the mask have an opening angle of >15°.

6. The method according to claim 5, wherein the openings in the mask have an opening angle of >25°.

7. The method according to claim 6, wherein the openings in the mask have an opening angle of >35°.

8. The method according to claim 1, wherein the at least one plate-shaped substrate has a thickness of <250 µm.

9. The method according to at least claim 1, wherein the relief structures are slit-shaped relief openings which are introduced into an edge region of the at least one plate-shaped substrate.

10. The method according to claim 9, wherein the relief openings have an elongated or spiral geometry.

11. The method according to claim 8, wherein the at least one plate-shaped substrate has a thickness of <150 µm.

12. The method according to claim 1, wherein the at least one plate-shaped substrate is selectively provided with an etching mask,
   whereby the etching attack is at least locally hindered, and
   whereby a mask with a height profile is produced.

13. The method according to claim 1, wherein the mask is provided at least partially with a metal layer.

14. A method for structured material application or removal by a reusable mask, comprising:
   producing the mask according to claim 1; and
   aligning the mask relatively to a material to be coated or removed.

15. The method according to claim 14, wherein the aligning is carried out using information obtained using surface structures, recesses, or deposited layers on the mask.

16. The method according to claim 1, wherein a plurality of modifications across a thickness of the at least one plate-shaped substrate are formed by a plurality of laser pulses along predefined machining lines forming a closed contour corresponding to a shape of the at least one opening, wherein the modifications are separated from each other, and then the at least one-plate shaped is treated on one side by a first etching solution.

17. The method according to claim 16, wherein the treatment by the first etching solution connects the modifications to each other along the closed contour, whereby material of the at least one plate-shaped substrate within the closed contour remains connected to adjacent regions of the at least one plate-shaped substrate only by a chromium etching resist layer, the method further comprising removing the chromium etching resist layer so as to remove the material connected thereto from the mask and form the at least one opening.

18. The method according to claim 17, wherein the chromium etching resist layer is removed by treatment by a further etching solution.

19. The method according to claim 16, wherein the treatment by the first etching solution connects the modifications to each other along the closed contour except for a local interruption in the machining lines which form a break-out tab, the method further comprising forming the at least one opening by separating the break-out tab.

20. The method according to claim 19, wherein the break-out tab is separated by immersion of the at least one plate-shaped substrate into a diluting or neutralizing solution.

21. The method according to claim 1, wherein the mask is provided with the relief structures and clamped in the frame prior to the at least one opening being formed in the mask by an etching attack of the laser-induced deep etching.

* * * * *